(12) United States Patent
Knickerbocker (10) Patent No.: US 8,048,794 B2
(45) Date of Patent: Nov. 1, 2011

(54) 3D SILICON-SILICON DIE STACK STRUCTURE AND METHOD FOR FINE PITCH INTERCONNECTION AND VERTICAL HEAT TRANSPORT

(75) Inventor: John U. Knickerbocker, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 12/543,110

(22) Filed: Aug. 18, 2009

(65) Prior Publication Data

US 2011/0042820 A1  Feb. 24, 2011

(51) Int. Cl.
*H01L 29/06* (2006.01)
(52) U.S. Cl. ........ 438/618; 257/774; 438/613; 438/614; 438/615; 438/616; 438/617; 438/15; 438/17; 438/18
(58) Field of Classification Search ............... 257/774; 438/613–618, 15, 17, 18
See application file for complete search history.

(56) References Cited

U.S. PATENT DOCUMENTS

| | | | |
|---|---|---|---|
| 6,521,530 B2 | 2/2003 | Peters et al. | |
| 6,528,892 B2 * | 3/2003 | Caletka et al. | 257/781 |
| 6,703,704 B1 * | 3/2004 | Alcoe et al. | 257/688 |
| 6,875,638 B2 * | 4/2005 | Yoneda et al. | 438/125 |
| 6,995,044 B2 * | 2/2006 | Yoneda et al. | 438/125 |
| 7,034,401 B2 | 4/2006 | Savastiouk et al. | |
| 7,186,586 B2 | 3/2007 | Savastiouk et al. | |
| 7,189,595 B2 * | 3/2007 | Magerlein et al. | 438/108 |
| 7,213,330 B2 | 5/2007 | Caldwell et al. | |
| 7,225,538 B2 | 6/2007 | Eldridge et al. | |
| 7,241,641 B2 * | 7/2007 | Savastiouk et al. | 438/106 |
| 7,317,256 B2 | 1/2008 | Williams et al. | |
| 2002/0135069 A1 * | 9/2002 | Wood et al. | 257/758 |
| 2002/0180013 A1 * | 12/2002 | Brofman et al. | 257/678 |
| 2005/0064644 A1 * | 3/2005 | Leib et al. | 438/202 |
| 2005/0189636 A1 * | 9/2005 | Savastiouk et al. | 257/678 |
| 2006/0027934 A1 * | 2/2006 | Edelstein et al. | 257/774 |
| 2008/0032457 A1 | 2/2008 | McWilliams et al. | |
| 2008/0036061 A1 * | 2/2008 | Chainer | 257/686 |
| 2008/0079150 A1 | 4/2008 | Simon et al. | |

* cited by examiner

*Primary Examiner* — Wai Sing Louie
*Assistant Examiner* — Bilkis Jahan
(74) *Attorney, Agent, or Firm* — F. Chau & Associates, LLC; Daniel P. Morris, Esq.

(57) ABSTRACT

A method of fabricating a thin wafer die includes creating circuits and front-end-of-line wiring on a silicon wafer, drilling holes in a topside of the wafer, depositing an insulator on the drilled holes surface to provide a dielectric insulator, removing any excess surface deposition from the surface, putting a metal fill into the holes to form through-silicon-vias (TSV), creating back-end-of-line wiring and pads on the top surface for interconnection, thinning down the wafer to expose the insulator in from the TSVs to adapt the TSVs to be contacted from a backside of the wafer, depositing an insulating layer which contacts the TSV dielectric, thinning down the backside of the wafer, opening through the dielectric to expose the conductor of the TSV to provide a dielectric insulation about exposed backside silicon, and depositing ball limiting metallurgy pads and solder bumps on the backside of the wafer to form an integrated circuit.

10 Claims, 6 Drawing Sheets

3D SILICON-SILICON DIE STACK STRUCTURE AND METHOD FOR FINE PITCH INTERCONNECTION AND VERTICAL HEAT TRANSPORT

TECHNICAL FIELD

This disclosure is directed to structures for use in three-dimensional integrated circuits, such as vertical stacked die, die on wafer, and wafer on wafer stacking.

DISCUSSION OF THE RELATED ART

Three-dimensional integrated circuits present several issues regarding the increase of system performance, power efficiency and cost. These issues can be addressed with a die stack, but this its own challenges. Challenges regarding a die stack include delivering power to the die stack, removing heat from die stack, and operation defects due to exposure to atomic particles, sub-atomic particles or radiation. For example, alpha particles from cosmic rays or emitted by the materials used in the die stack or module can impact circuit operation and can cause machine errors.

Three-dimensional integrated circuits need an increased interconnection on and off the die stack to support a high level of communication across the die stack. For example, the need for increased memory and processor scaling and interconnection as microprocessors go from one or a few processor cores to 10's or hundreds. As the number of cores increases, the cores become starved for high bandwidth and low memory latency. The same may be true for other types of system integration products, such as the interconnection of FPGA and dies to each other, FPGA and dies to memory, memory interface hub chips to local storage cache, etc.

Traditional packaging lacks sufficient input/output (I/O) connections to and from the chip, and even if there were enough connections, the power required to drive data to and from the chip to memory and to drive the memory chips themselves would become excessive.

One way to provide sufficient power and interconnection is to provide a low latency, low inductance path of connection from one chip to another by use of a die stack, where one or more die have through silicon vias (TSV) of thinned silicon die in the die stack, along with silicon-silicon interconnections (SSI), or with one or more die and die stacks on a silicon package again with high interconnection across SSI connections and a silicon package between die and die or die and die stacks or between die stacks, which together can provide electrical links to interconnect die from one level to another within a die stack.

This can support performance advancement by integrating homogeneous or heterogeneous die with short distance electrical connections between circuits, thus providing low latency and low power communications while supporting continuing improvements in system performance.

In addition, even though a stacked die configuration using TSV and SSI can improve power efficiency, there also needs to be a means to deliver power (i.e. voltage and current) and remove excess heat efficiently from the die stacks and/or die stacks on a silicon package in a module to prevent the semiconductor circuits from over heating, and/or to prevent the semiconductor circuits from operating at an elevated temperature for extended time periods, which can cause a premature system failure due to, for example, electromigration.

Another challenge is that of localized heat removal from a hot spot on a die or from any strata level within the thinned die stack to a heat spreader, heat fins or a cold plate to remove excess heat from the die stack and/or module.

Silicon is a good thermal conductor, and when used with a normal die thickness on the order of about 700 um to 800 um thickness, can remove heat from a hot spot and spread it across the silicon die. In the case of a flip chip die, heat can pass from the circuits to the back side of the silicon die to be removed via a thermal interface material contacting the die, where a cold plate or heat spreader removes the heat from the die.

For a thinned die stack, the ability to remove heat from a hot spot and or a die stack can be more challenging.

If a die is thinned to, for example, 50 um thick, then hot spots do not spread effectively in a horizontal direction, as compared to full thickness Si. Likewise, the interlayer dielectric layers used for signal and power distribution on a die can act to reduce heat transfer through the die stack.

Thus, vertical stacked die, die on wafer, or wafer on wafer stacking require fine pitch interconnections but also need a high yield method of alignment and assembly, efficient vertical thermal transport and means to protect the active circuits from high energy particles. Many existing structures do not achieve these elements in a vertical stack.

SUMMARY OF THE INVENTION

Exemplary embodiments of the invention as described herein generally include methods and systems for improving heat removal while maintaining a high density of signal and power interconnections by optimizing the thickness of the thin silicon layer and using thermal paths to remove heat from hot spots and high power areas. High density vertical interconnections and through-silicon-vias (TSV) are used to achieve electrical interconnection while leaving room for macros in a silicon strata levels, using mechanical/thermal interconnections to support signal, power and thermal transport between strata levels in a stack.

The thermal paths can utilize high thermal conductive materials, which may also be electrically conductive, such as solder in SSIs, copper used in wiring and TSVs, or simply adding thermal interconnections for improved heat transfer and/or mechanical integrity. The thermal paths can also utilize materials having high thermal conductivity but which are electrically insulating, such as BeO, SiC, carbon nanotubes, etc. Thus, to aide in removing heat from a die stack, thermal vias can be added to an ILD (inter-layer-dielectric), and underfills with improved thermal conductivity can be added between silicon strata levels and between other interconnections, such as solder interconnections, Cu—Cu and other electrical connections. The area of a conductor between silicon strata levels can be increased. Thus, the use of thermal TSVs and SSIs can aide in heat removal from a die stack, and the use of a larger SSI area also increases heat removal.

Thin Si layers are interconnected using solder of various compositions and size interconnections to permit high density arrays of signals in vertical paths or buses along with areas for thermal transport and areas for power feed throughs.

The proper choice of materials for interconnection can help avoid soft errors due to subatomic or cosmic particles that can cause errors in the resulting circuits. The use of low alpha solders such as alloys of AuSn, In, Sn, SnCu, In—Ni—Cu, SnAg or other alloys can service these interconnections. Large blocks of solder are used for thermal interconnection along with small interconnections of solder microbumps for signals and small or intermediate size diameter bumps for power. Bumps can be taylored for electrical, thermal, power and mechanical integrity. Areas over macros can have mechanical/thermal pads or an array of bumps, or other shapes, and the option of thermal vias in some or all of the BEOL and FEOL where it aids thermal conduction and fits an overall design. Adhesive underfill or no-flow underfills and/or combinations with seal bands can aide in mechanical integrity and corrosion protection of interconnections.

Ball-limiting metallurgy (BLM) is used for each silicon layer to provide a grid of power feed throughs at one or more voltages to support power distribution from TSV dense regions to macro regions lacking TSV's. A dielectric can be provided over power and/or ground distribution wiring to create a micro connection area on one side of an SSI and the same for the other side to create a large current carrying capability without added fat wire layers, thus keeping costs down in power distribution while maintaining efficient circuit dense regions. This can be accomplished by interconnecting wiring connections to the pads connected to solder bumps to create a wiring distribution or mesh to provide a power grid o which can support the application voltage levels and system requirements.

According to an aspect of the invention, there is provided a method of fabricating a thin wafer die, the method including creating circuits and front-end-of-line wiring on a silicon wafer, drilling holes in a topside of said silicon wafer, depositing an insulator on said drilled holes surface to provide a dielectric insulator to the silicon, removing any excess surface deposition from the surface, putting a metal fill into said holes to form through-silicon-vias (TSV), creating back-end-of-line wiring and pads on the top surface for interconnection, attaching a glass handle to the wafer with a temporary adhesive, thinning down the wafer to expose the insulator in from the TSVs, wherein said TSVs are adapted to be contacted from a backside of said wafer, depositing an insulating layer which contacts said TSV dielectric, thinning down the backside of said silicon wafer, opening through the dielectric to expose the conductor of the TSV to provide a dielectric insulation about exposed backside silicon, and depositing ball limiting metallurgy pads and solder bumps on the backside of the wafer, wherein an integrated circuit is formed on said wafer or between die from multiple wafers.

According to a further aspect of the invention, the method includes forming solder connections between the thinned silicon layers from said solder bumps and said ball limiting metallurgy pads, wherein an integrated circuit is formed between die from multiple wafers.

According to a further aspect of the invention, the holes are drilled with a deep reactive ion etch (DRIE).

According to a further aspect of the invention, the top surface insulator is removed by a chemical-mechanical polish (CMP).

According to a further aspect of the invention, the metal fill comprises a barrier, an adhesive, and a conductor.

According to a further aspect of the invention, the metal fill comprises one of Titanium-Titanium Nitride-Tungsten (Ti—TiN—W), Tantalum-Tantalum Nitride-Tungsten (Ta—TaN—W), Titanium-Titanium Nitride-Copper (Ti—TiN—Cu), Tantalum-Tantalum Nitride-Copper (Ta—TaN—Cu).

According to a further aspect of the invention, the back-end-of-line pads are ball limiting metallurgy (BLM) pads and said interconnections are formed from solder.

According to a further aspect of the invention, the glass handle wafer is attached by means of grinding, polishing, and a reactive ion etch.

According to a further aspect of the invention, the insulating layer is one or more of a plasma-enhanced chemical vapor deposition (PECVD) oxide layer and a nitride layer.

According to another aspect of the invention, there is provided a method of fabricating a thin wafer die, the method including creating circuits and front-end-of-line wiring on a silicon wafer, creating at least a portion of back-end-of-line wiring and pads on a top surface of said wafer for interconnection, drilling holes in said top surface of said silicon wafer, depositing an insulator on said drilled holes surface to provide a dielectric insulator to the silicon, removing any excess surface deposition from the surface, putting a metal fill into said holes to form through-silicon-vias (TSVs), completing the creation of said larger back end of line wiring and surface pads, if not already completed, attaching a glass handle to said silicon wafer with temporary adhesive, thinning down the wafer to expose the insulator in from the TSV's, wherein said TSVs are adapted to be contacted from a backside of said wafer, depositing an insulating layer such as PECVD oxide and/or nitride layer which contacts said TSV dielectric, thinning down the backside of said silicon wafer, opening through the dielectric to expose the conductor of the TSV to provide dielectric insulation about the exposed backside of said silicon wafer, depositing ball limiting metallurgy pads and solder bumps on the backside of the wafer, and forming solder connections between the thinned silicon layers from said solder bumps and said ball limiting metallurgy pads, wherein an integrated circuit is formed between die from multiple wafers.

According to a another aspect of the invention, there is provided a method of fabricating a wafer die stack, the method including testing an integrated circuit formed on a silicon wafer while said wafer is attached to a handler, wherein a known good wafer that passes said test is kept for further processing, dicing said known good wafer, releasing said handler from said known good wafer, attaching said known good wafer to a substrate with an underfill, acquiring one or more known good wafers, releasing their handles, and attaching each said wafer to a layer below with a silicon-to-silicon interconnection, wherein a wafer stack is created, forming solder connections between the thinned silicon layers from said solder bumps and said ball limiting metallurgy pads by heating said stack in a reflow furnace to melt said silicon-to-silicon interconnections solder and bumps, wherein an integrated circuit is formed between die from multiple wafers, and testing said wafer stack.

According to a further aspect of the invention, the method includes placing a silicon interposer between said die stack and said substrate before attaching said die stack to said substrate.

According to a further aspect of the invention, the die stack is tested on said silicon interposer.

According to a further aspect of the invention, the silicon interposer is larger in horizontal directions than said die stack, wherein said substrate has a different coefficient of thermal expansion than said die stack, and wherein stresses resulting from attaching said die stack to said substrate are reduced.

According to a further aspect of the invention, the handler is attached to a top side of said wafer, further comprising attaching bottom surface metallurgy (BSM) to the backside of said wafer, attaching a backside handler to said wafer, and removing the handler from said top side of the wafer, and after releasing the handler from the backside of the wafer, attaching solder a connection area and testing said stack.

According to a further aspect of the invention, the wafers are attached wherein front-end-of-line circuits of each wafer are facing each other.

According to a another aspect of the invention, there is provided a silicon-silicon die stack structure comprising a substrate, a plurality of thin silicon die wafer layers disposed on said substrate with a high density of vertical through-silicon-vias (TSVs) through the wafer layers for electrical interconnectivity, a silicon-silicon interconnection between each wafer layer, said silicon-silicon interconnection including a plurality of metallic interconnection and thermal paths surrounded by an adhesive dielectric layer, wherein said silicon-silicon interconnections further include solder interconnections of various size to provide high density arrays of signals in vertical paths and areas for thermal transport and power feed through, and underfills with improved thermal conductivity between silicon strata levels and between other interconnections for improved mechanical integrity and corrosion protection of interconnections, wherein larger blocks of solder are used for thermal interconnection, intermediate size diameter blocks of solder are used for power transmission, and smaller blocks of solder are used for signal transmission.

According to a further aspect of the invention, the thermal paths utilize materials having a high thermal conductivity and a high electrical conductivity.

According to a further aspect of the invention, the thermal paths utilize materials having a high thermal conductivity and a low electrically conductivity.

According to a further aspect of the invention, the solder materials have a low alpha particle emittivity.

According to a further aspect of the invention, an interconnection density for connections between wafer layers has a pitch of about 50 microns down to about 10 microns, and an interconnection density for connections from a wafer layer to a substrate has a pitch of about 150 microns up to about 250 microns, wherein vertical interconnections in a front-end-of-line of a wafer have a diameter of on the order of sub-microns, vertical interconnections through in a back-end-of-line of a wafer have a diameter on the order of a micron, and TSVs have a diameter on the order of 10 microns, and wherein the thin wafers have a thickness of about 50 to about 30 microns.

According to a further aspect of the invention, the method includes a silicon interposer between said stack of wafer layers and said substrate.

According to a further aspect of the invention, the silicon interposer has a larger horizontal dimension than the silicon die wafers in the stack, wherein said substrate has a different coefficient of thermal expansion than said die stack, and wherein stresses resulting from attaching said die stack to said substrate are reduced.

According to a further aspect of the invention, the thin silicon die wafers are disposed wherein a front-end-of-line portion of each wafer faces each other.

According to a further aspect of the invention, ball-limiting metallurgy is used for each silicon die wafer to provide a grid of power feed throughs to supply power from TSV dense regions to regions lacking TSV's.

DETAILED DESCRIPTION OF EXEMPLARY EMBODIMENTS

Exemplary embodiments of the invention as described herein generally include vertical stacked dies, dies on wafer, and wafer on wafer stacking. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

Traditional wafer fabrication involves putting down active circuits and wiring on one side of a silicon wafer. Typically, wafers used for 2-dimensional integrated circuits are from 430 microns thick down to 270 microns thick. The first portion of the integrated circuit fabrication, where the active transistors and local wiring to interconnect the transistors are patterned in the semiconductor, is called the called front end of line (FEOL). The portion of integrated circuit fabrication line where the coarse wiring that connects longer distances across individual chip and goes to off chip locations are interconnected with wiring on the wafer is called back end of line (BEOL) wiring.

The material between the silicon die levels is referred to as the silicon-silicon interconnection (SSI). The SSI can be a metal interconnection, but can also include an adhesive dielectric layer, such as epoxy fillers such as $Al_2O_3$, $SiO_2$, AlN to help control the coefficient of thermal expansion and other properties. According to embodiments of the invention, the SSIs could be solder, solder and copper, a polymer ball with solder around it, depending on the application. In an embodiment of the invention, the SSI can be comprise a top silicon side pad or metallurgy, such as TiWCuNiAu, a copper pad or a stud, a solder or metal stud, and a bottom silicon side pad or metallurgy similar to the top side silicon pad or metallurgy. The solder may be a lead-free solder, such as SnAg, SnCu, SnAgCu, or AuSn. In another embodiment of the invention, the SSI can be include the electrical interconnections described above and/or a dielectric adhesive which can act to improve mechanical integrity of the structure, aide in heat transfer and/or aide in structure reliability, and/or a seal band structure to seal the structure to prevent penetration of moisture or other liquids, gases or solids that might disrupt the function of the interconnections. The dielectric adhesive can include a BCB (Benzocyclobutene)-based dielectric and polyimide-based dielectrics. In another embodiment of the invention, the SSI can be a dielectric layer, known as an interlayer dielectric, with electrically conductive filler particles such that when compressed between pads or studs on the silicon layers, the conductive particles form an electrical connection. Such a dielectric layer can act as an adhesive and provide enhanced mechanical integrity to a wafer stack. Another alternative SSI structure according to an embodiment of the invention includes electrical and optical interconnections, such as vertical hole with or without a lens and or an optical waveguide to permit light transmission. Another alternative SSI structure according to an embodiment of the invention includes a dielectric layer bond, such as $SiO_2$ or SiN, with vertical metal conductors, such as copper interconnections or plated copper vias with associated an dielectric liner and seed such as Ta/TaN/Cu or Ti/TiN/Cu.

Adhesives and underfills are also used between the silicon wafer layers, and typically include a dielectric layer such as an epoxy with filler, such as $Al_2O_3$, $SiO_2$, AlN, etc., to help control coefficient of thermal expansion and other properties. In addition, adhesives and underfills can serve as SSIs if the adhesives/underfills include a filler of small conductive particles that create electrical interconnection between pads of desired electrical interconnection when compressed.

According to other embodiments of the invention, solder can be used for attaching the die stack to the substrate, and between silicon die wafers themselves. Due to performance considerations, the solder interconnections have a smaller size between the die stack layers and a larger size between the wafer die stack and the substrate. If an interconnection feature size has about a 25 μm diameter with about a 50 pitch, this would represent a small block of solder, and intermediate and larger sizes would be correspondingly larger and be dependent upon the architecture of the structure of interest, the solder or interconnection material, stress level, location of hot spot for heat transfer, etc. In this case, an intermediate size may be greater than about 25 μm and less than about 200 μm size in diameter, and a large size may be greater than about 200 μm in diameter. If the small interconnection feature size were about 5 μm in diameter with about a 10 μm pitch, then the intermediate and large size blocks of solder would again be correspondingly larger, such as but not limited to, greater than about 5 μm in size up to about 50 μm in size for intermediate size blocks, and greater than about 50 μm in size for a large size block.

One process step during wafer processing is the introduction of through-silicon-vias (TSV). A TSV should be fabricated to have a conductor inside a dielectric so that the conductor is electrically insulated from silicon of the wafer. For example, when using a copper conductor, to prevent copper from diffusing through the silicon, a barrier layer between the silicon and copper is needed, on which is typically an adhesive layer on which the conductor is created. Layers of Ti/TiN or Ta/TaN are commonly used when using copper conductors as wires or small vias to provide the adhesion and barrier against diffusion of copper into silicon. Diffusion of copper into silicon should be prevented because copper can cause the transistor circuits to function improperly. Both copper and tungsten are good conductors and can be used as electrical connection from one circuit to another or to provide power and to ground power, although copper has better conduction properties compared to tungsten.

There are many ways to install CMOS compatible TSVs into a wafer. For example, TSVs can be installed at the beginning of the fabrication process, in the middle of the fabrication process, or at the end of the fabrication process. According to an embodiment of the invention, TSVs are installed after active transistors are in place but do not go all way thru the wafer. The vertical connections are present during FEOL and BEOL processing, and after the wafer is attached to a glass handler and thinned, the TSVs contact the back side and go thru the thin silicon wafer. However, in fabricating a wafer stack, the TSVs do not necessarily connect one layer to another until there is an SSI connecting the two layers.

Figure 1:
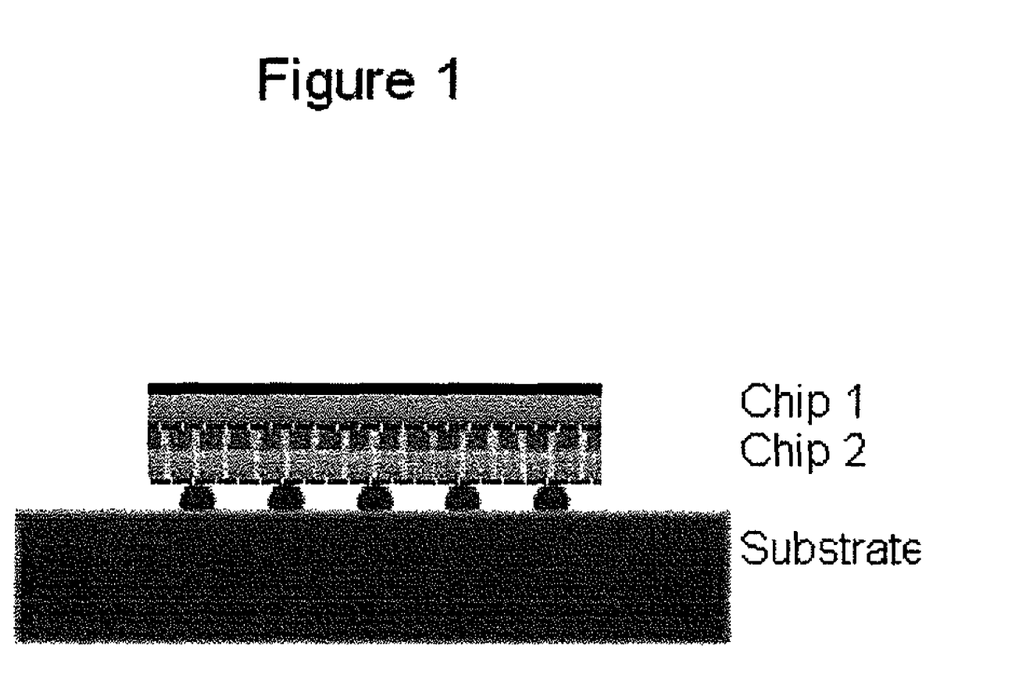
FIG. 1 depicts a portion of a silicon die/wafer stack, according to an embodiment of the invention.

In traditional methods of creating an integrated circuit (IC) package module, one wafer is joined to a package, and wire bonding is used to connect edge pads of the wafer to the package. However, according to an embodiment of the invention, an area array connection technology is used to connect a whole array (area) of a chip to a package or to another chip. Referring now to FIG. 1, which depicts a portion of a silicon die/wafer stack, there is a dense footprint of interconnections that go from one layer to the next. Between Chip1 and Chip2 would be silicon-silicon interconnections (SSIs), but the connections between Chip2 and the Substrate would be more traditional interconnections, such as solder, which are coarser than the SSIs.

However, to support the bandwidth demands of an IC stack, a high density of connections between Chip1 and Chip2 is needed, so that the interconnect density increases and pitch decreases. A typical interconnection density for connections between chips would have a pitch of about 50 microns down to about 10 microns. The interconnect density from a chip to a package is less, typically from about 150 microns up to about 250 microns, so there are not as many interconnections. Chip1 can communicate with the Substrate through Chip2 or by using interconnects bypassing Chip2, but most interconnects will be with Chip2. Chip2 can pass signals to Chip1, but power delivery to Chip1 from the Substrate has to go thru Chip2 to get to Chip1. Similarly, removing heat involves removing heat from backside of Chip1, but heat generated in Chip2 has to go thru Chip1 to exit.

The gray bumps between Chip2 and the Substrate in FIG. 1 represent solder connections. Although these solder bumps are typically uniformly distributed, if a wafer stack has hot spots with a high heat density, or needs more current or more connections in one area of the chip, can have areas of higher bump density to provide interconnectivity to pass more current or heat vertically through the bumps. In a full thickness chip, hot spots do not present a challenge because heat can be dissipated horizontally in an x-y direction. Heat removal is a challenge for thin chips because heat cannot be easily transferred horizontally as the chip is so thin, so heat must be removed vertically to avoid overheating that can compromise reliability or damage the chip.

Silicon is good heat conductor, with a conductivity of about 115 W/m K. A substrate is typically made from either an organic polymer or ceramic. Ceramics are poor heat conductors, with a conductivity of about $\frac{1}{10}$ that of silicon, and polymers have a conductivity of about $\frac{1}{100}$ as silicon. On the other hand, metals are good thermal conductors as well as good electrical conductors, so metallic and/or silicon-based electrical connections provide ways to both remove heat as well as provide electricity.

Another aspect of IC fabrication is testing. ICs should be tested at the wafer level, to know which die are good and bad, and tested again once good die are assembled into a module, such as a die stack on a substrate, to determine whether the whole module is connected. Module level testing can be performed on a stack on a substrate. If the stack is good, it can be passed on to the next fabrication step, otherwise it can be discarded or re-worked. During wafer level testing, sample testing is performed where probes touch the wafer and test a small sample of the interconnections to know if the die is good or bad. There are too many interconnects to test all of them. Circuits are built into each chip than can perform a self test with a limited number of contacts.

Traditional chips can only be contacted by test hardware at a coarse pitch of connections, for example, about 200 microns. Now, however, wafers have a much higher interconnect density, with pitches from about 50 micron down to about 10 microns. Thus, the number and density of connections has become very high, on the order of tens or hundreds of thousands per chip, which presents challenges for testing.

Another aspect with regard to testing a vertical stack is that the silicon wafers themselves are not as strong. Traditional wafers are on the order of about 700-800 microns thick, while the thin wafers used for 3D ICs are about 50-30 microns thick per layer. These thin wafers are not very strong, and need to held without being damaged. Thus, a thin wafer is attached to a mechanical handler, such as a piece of glass or a thick piece of silicon, after which the wafers are tested. If the wafer is good, it is assembled into a stack using adhesives or underfills to glue one layer to the next, so that it is stronger in the composite.

Another challenge regarding thin wafers is that their thinness renders them vulnerable to damage from alpha particles. While traditional 2D ICs are thick enough such that an alpha particle can be prevented from penetrating all the way through a die wafer, the wafers in a die stack are thin enough that an alpha particle can easily penetrate several layers in a stack. Protection from alpha particles can be provided by the choice of materials used in fabricating the stack, by choosing materials with low alpha emittivity, such as Indium, or materials having few alpha-emitting containments. The die stack can also be protected from external sources of alpha particles by the use of thicker underfills or backside shielding.

Figure 2A:
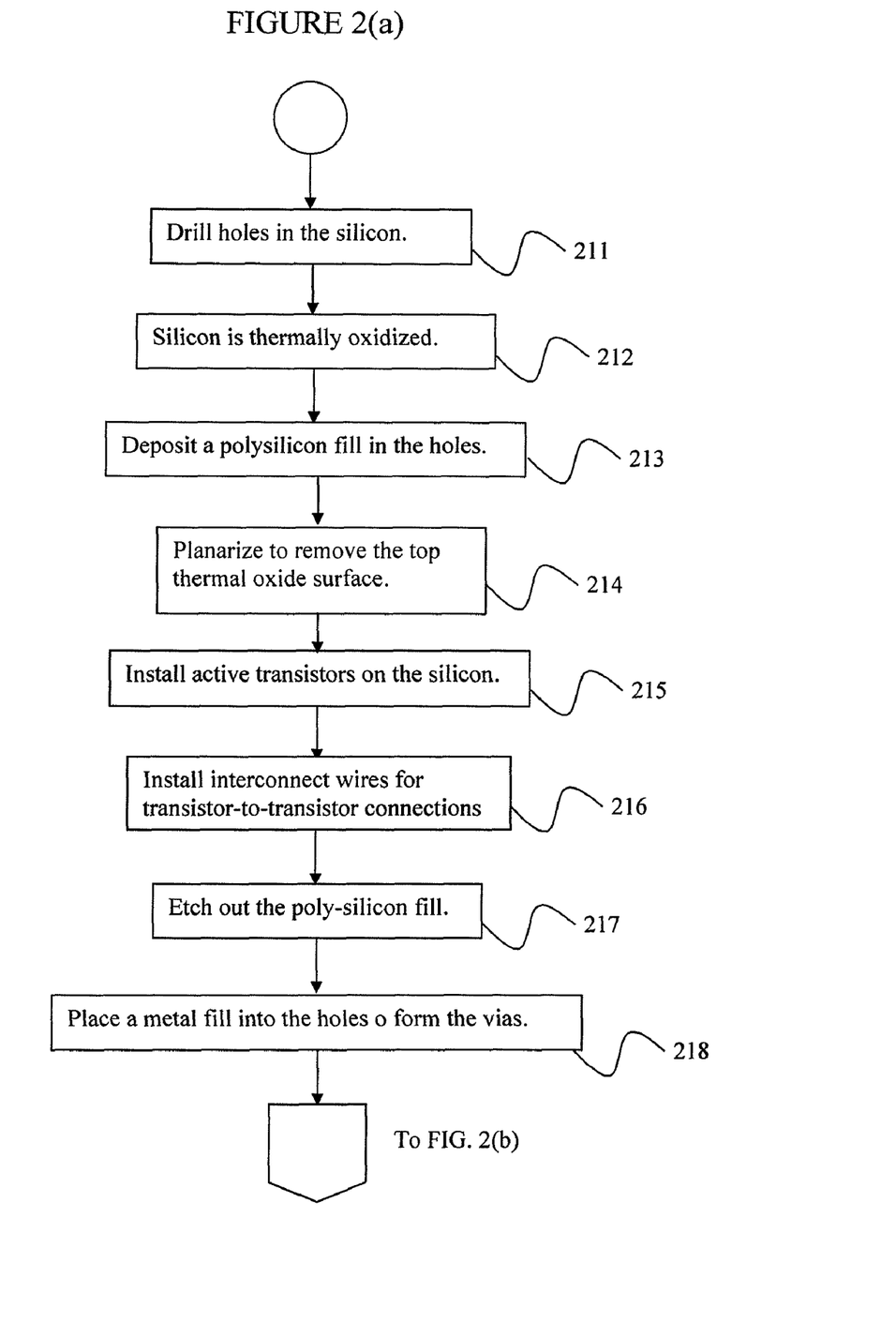
FIGS. 2(a)-(b) is a flow chart of an exemplary process for creating a thin wafer, according to an embodiment of the invention.
Figure 2B:
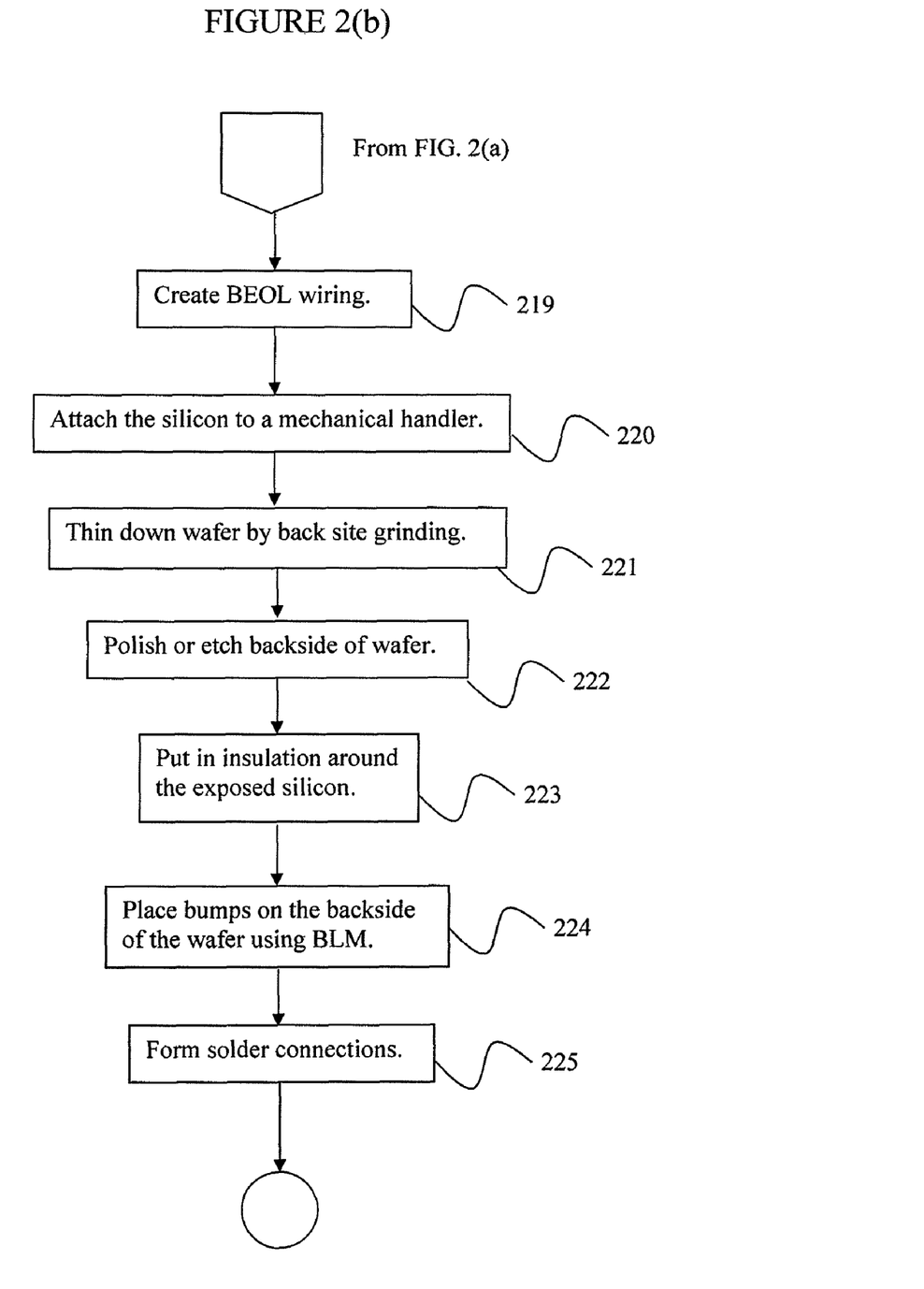
Figure 3:
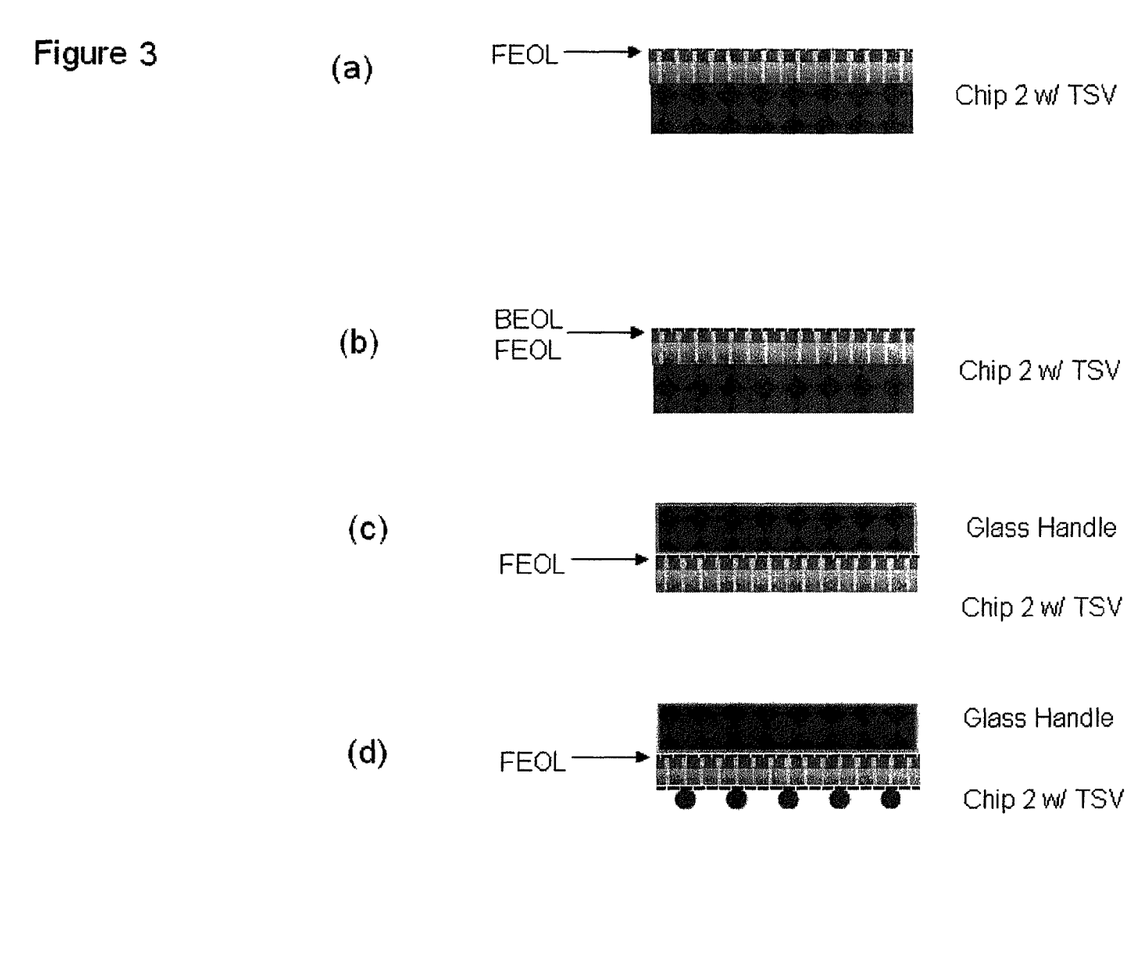
FIGS. 3(a)-(d) illustrate stages in the creation of a thin wafer of FIG. 2, according to an embodiment of the invention.

FIGS. 2(a)-(b) is a flow chart of an exemplary process for creating a thin wafer, according to an embodiment of the invention. A fabrication process begins with the FEOL, in which active circuits are put in using reactive-ion etching (RIE). Referring now to FIG. 2(a), given a silicon chip, holes are drilled in the silicon at step 211, and the silicon is thermally oxidized at step 212. Heating the silicon can oxidize the silicon top surface and the inside of the holes to create an electrical insulator, so that wires going through the holes do not short to rest of silicon chip. Next, at step 213, a poly silicon fill is deposited in the holes, which are planarized at step 214 to remove the top thermal oxide surface. Now, the FEOL circuits are created: active transistors would be installed on the silicon at step 215, small interconnect wires for transistor-to-transistor connections would be installed at step 216, and the poly-silicon would be etched out at step 217 as it is a poor electrical conductor. Note that metals such as copper or tungsten cannot be put in front as they are not compatible with the active circuits, and an insulator needs to be resent before the FEOL is created. Next, after etching out the polysilion, a metal fill can be placed into the holes at step 218 to form the vias. Examples of a metal fill include tungsten CVD, copper plating, trinitride liner with seed, and tantalum nitride with seed. FIG. 3(a) is a schematic diagram of a chip with TSVs and FEOL wiring. Moving on now to FIG. 2(b), at step 219, the BEOL wiring is created. FIG. 3(b) is a schematic diagram of a chip with TSVs with FEOL and BEOL wiring.

At this stage, the silicon is still at full thickness, which is about 130 microns. The next step 220 is to attach the silicon to a mechanical handler, so the silicon wafer does not flop about when it is thinned down to attach the vertical interconnects thru the wafer. For example, the wafer can be glued to a glass sheet. FIG. 3(c) is a schematic diagram of a chip showing the glass handle and the FEOL. The wafer is thinned down at step 221 by back site grinding, which can be either a coarse grind or a fine grind, followed at step 222 by either polishing the wafer or performing a deep RIE operation on the back side of the wafer. The grinding can create cracks that go part way into a wafer, so switching to an RIE operation can remove some of the cracked silicon to leave an undamaged backside. The result is a thinned wafer where the vias put in earlier now contact the backside. Insulation is put in around the exposed silicon at step 223, bumps are placed on the backside of the wafer at step 224 by putting down ball-limiting metallurgy (BLM), and solder connections are formed at step 225. Solder is typically used on one ball limiting metallurgy pad so that when joined to another ball limiting metallurgy pad of another layer of silicon, the solder contacts, wets and creates a conductive path between the two silicon layers. The back end of wiring layers are usually made of copper conductors and vias, although sometimes aluminum wire layers are used. Ball limiting metallurgy (BLM) pads can be deposited by evaporation, sputtering or plating. Both plating and sputtering are commonly used. The solder can be plated on the BLM pads or can be deposited by evaporation, sputtering or a transfer process such as injection molding. FIG. 3(d) is a schematic diagram of a chip with TSVs showing the glass handle and the bumps on the bottom. It is to be understood that this process flow is exemplary and non-limiting, and many variations on this process flow will be readily apparent to those of skill in the art.

Figure 4:
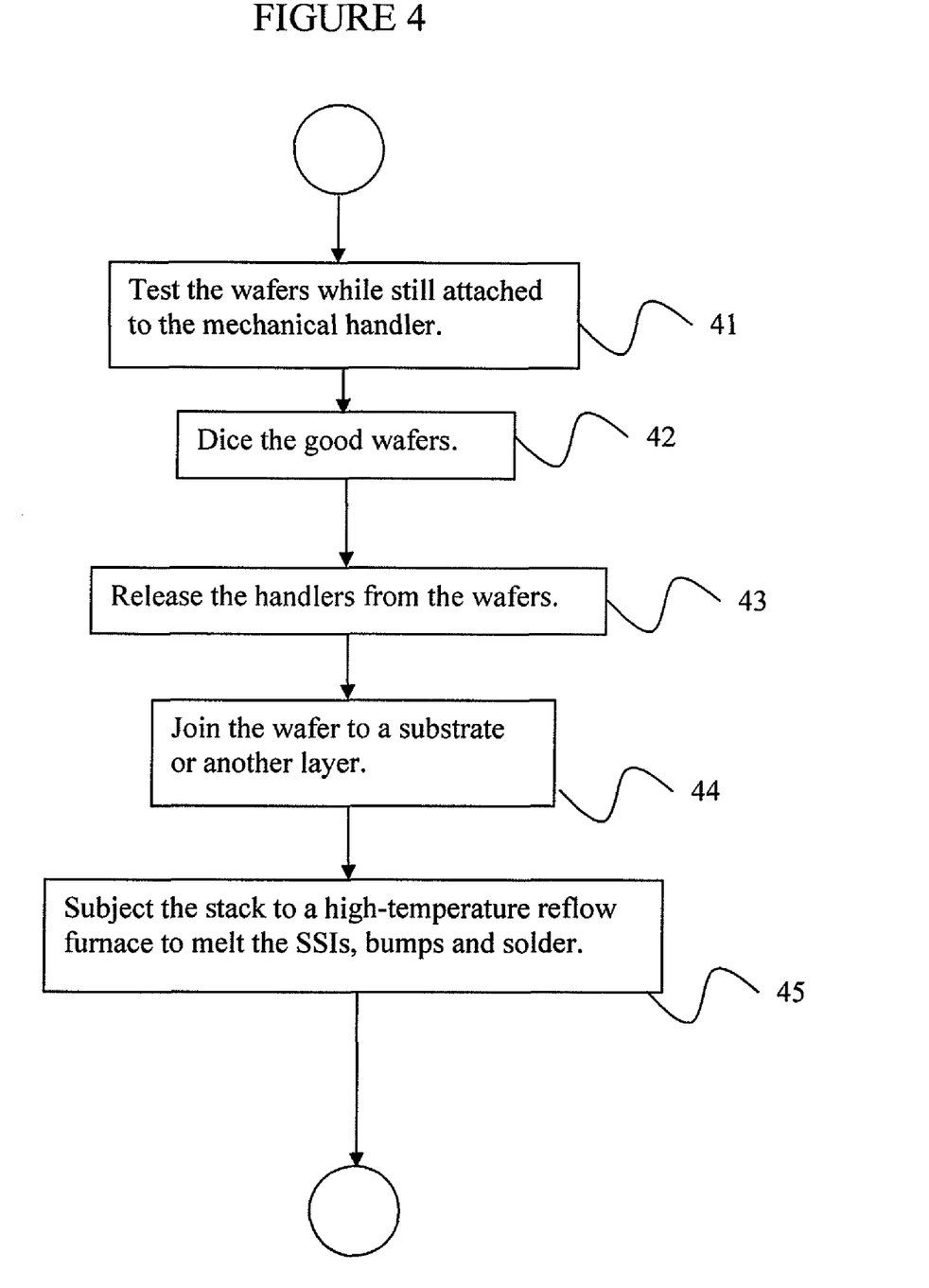
FIG. 4 is a flow chart of an exemplary process for creating an IC package, according to an embodiment of the invention.

FIG. 4 is a flow chart of an exemplary process for creating an IC package, according to an embodiment of the invention. To fabricate an assembly using thin wafers of silicon, one needs to know which wafers are good. Thus, at step 41, the wafers are tested while still attached to the mechanical handler. At step 42, the good wafers are diced with or without the handler attached. Having the handler attached provides a means to hold and transport the wafer, otherwise a vacuum process can be used to transport the wafers so they do not break. Now, the stack can be built up by joining the wafers. The handlers can be released at step 43 using a laser or chemical release process to release the glue on the handler, and then at step 44, the wafer is joined to a substrate or another layer, after which another layer can be released from its handler. Multiple die can be joined at the same time by stacking up released wafers on a substrate and then subjecting the stack at step 45 to a high-temperature reflow furnace to melt the SSIs, bumps and solder. The resulting stack can then be tested.

To form solder connection between silicon layers, the two layers are typically put in contact, the temperature is raised, the solder melts and then the parts are cooled. The cooled solder connections provide electrical connections between the layers. For process enhancement, a flux is sometimes used to reduce oxides, create good join. Typically, the reflow temperature is done with a controlled atmosphere or gas, so that rather using air, which is approximately 80% nitrogen gas and 20% oxygen, a 100% nitrogen gas is used. Sometimes a nitrogen and hydrogen gas mixture is used, known as a forming gas, with anywhere from about 5% to about 10% hydrogen in nitrogen, or at the extreme, a 100% hydrogen has may be used, although this is less common.

Alternatively, sometimes a thermo-mechanical joint is formed by use of force and temperature, rather than just temperature as indicated above.

Integrated circuits can be formed on each silicon strata level, but also can be more complex integrated circuits or systems resulting from multiple silicon layers. For example, one can have a memory circuit spread across multiple silicon layers, or a clock function circuit spread across multiple silicon layers. For a system function, one can have silicon processor layers and memory and field programmable gate array layers each on different silicon layers that are interconnected.

In a variation of the above die stack assembly procedure, a silicon interposer (IP) can be placed between the stacked die and the substrate. An interposer is a thin silicon wafer without any active circuits. In another variation of the above die stack assembly procedure, the silicon interposer can act as platform for testing the die stack before it is joined to the substrate.

According to another embodiment of the invention, the horizontal size of the IP can be changed to provide stress reduction for dies being joined to a package. This is useful for providing stress relief for thinner wafers. The thermal coefficient of expansion for silicon is about 3 ppm, while that of an organic package is about 18 ppm, so one shrinks more than the other when joined. This expansion differential causes stress that can break the package. A larger IP can reduce the stresses applied to the chip to support weaker materials without having them fracture Once chips have been tested on the IP and are known to be good, the chips can be glued together at that level with an underfill or an adhesive, and be joined to a substrate of a different coefficient of thermal expansion. Such a die stack is mechanically stronger than a single wafer and has been electrically tested. It is easier to join a stack to a substrate than a single wafer since stack is stiffer and less likely than a thin chip to flop about. The IP/stack combination can be made stiff and flat or planar, and have good yields when turned into modules. The difference in horizontal size of the IP reduces stresses and aids testability before joining the stack to a substrate. A thick silicon interposer can also provide protection from external alpha particles.

In another embodiment of the invention, the assembly process flow can be varied for thicker wafers, i.e. for wafers thicker than about 50 microns. In this embodiment, there is no interposer, but before the wafer's are diced, a handle is attached to the top side of the wafer, the wafer is thinned down to the TSVs, bottom surface metallurgy pads are attached, a backside handler is attached and the top side handler is removed. Then after the handler is released, solder is attached to the connection area and the stack is tested.

In another embodiment of the invention, a stack of face-to-face die can be created, where FEOL circuits are next to other FEOL circuits. This configuration allows for fast interconnections if there are only two dies in a stack. However, this is not an optimal configuration if there are more than two die in a stack because of the TSVs in between layers.

These process flows are exemplary and non-limiting, and variations within the scope of an embodiment of the invention in how layers and interconnects may be assembled will be apparent to one of skill in the art.

Figure 5:
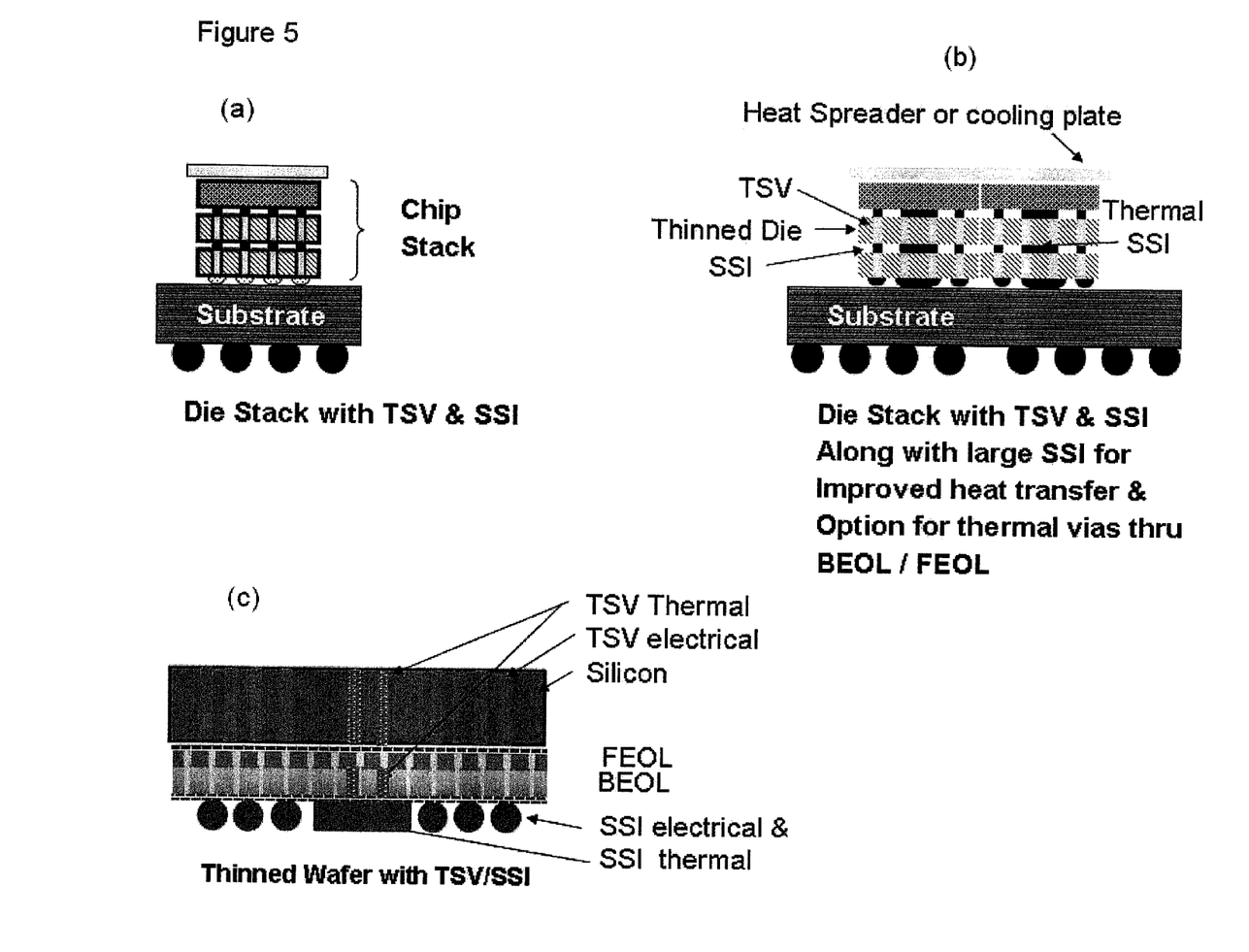
FIGS. 5(a)-(c) depict examples of finished die stack assemblies, according to embodiments of the invention.

FIGS. 5(a)-(c) depict examples of finished die stack assemblies, according to embodiments of the invention. FIG. 5(a) depicts an chip stack with a uniform array of connections. FIG. 5(b) depicts a chip stack with dense regions of TSVs and SSIs for thermal conduction and a heat spreader at top. Both copper and silicon can be used for the TSVs and SSIs, as both are good heat conductors, with copper being in addition a good electrical conductor.

FIG. 5(c) depicts an example a thinned wafer with TSVs and an SSI. For heat to be transferred vertically through a stack, more than one piece of stack should be a good thermal conductor, not just the connections. For example, a larger area of SSIs or solder, as opposed to small bumps, will improve heat conductivity. Heat passes through the FEOL and BEOL, so having more vertical connections aids in heat transfer. Using copper instead of silicon for the vertical vias can also aid in heat removal, as copper has about twice the heat conductivity as silicon. The vertical connections in the top portion of FIG. 5(c) are TSVs, which could be made from copper or tungsten, and could have different diameters depending on the thickness of the silicon and the density of the connections. The FEOL and BEOL typically have a different via density. BEOL vias are usually larger in diameter and FEOL vias are usually smaller in diameter. Vias in the front of a wafer, next to the circuits, are usually small, on the order of sub-microns in diameter, while vias through the BEOL circuits are on the order of a micron in diameter. TSVs going through silicon are typically on the order of about 10 microns in diameter. Therefore, different numbers of small features are needed for the FEOL, the BEOL, and for TSVs to help transfer heat up through a stack in a localized spot.

A die stack according to an embodiment of the invention can remove up to about 90 W through a stack of 4 thin die and have temperature gradient of less than about 9 degrees C., with heat being taken off the topmost chip.

While the present invention has been described in detail with reference to exemplary embodiments, those skilled in the art will appreciate that various modifications and substitutions can be made thereto without departing from the spirit and scope of the invention as set forth in the appended claims.

What is claimed is:

1. A method of fabricating a thin wafer die, the method comprising the steps of:
creating circuits and front-end-of-line wiring on a silicon wafer;
drilling holes in a topside of said silicon wafer;
depositing an insulator on said drilled holes surface to provide a dielectric insulator to the silicon;
removing any excess surface deposition from the surface;
putting a metal fill into said holes to form through-silicon-vias (TSV);
creating back-end-of-line wiring and pads on the top surface for interconnection;
attaching a glass handle to the wafer with a temporary adhesive;
thinning down the wafer to expose the insulator in from the TSVs, wherein said TSVs are adapted to be contacted from a backside of said wafer;
depositing an insulating layer which contacts said TSV dielectric;
thinning down the backside of said silicon wafer;
opening through the dielectric to expose the conductor of the TSV to provide a dielectric insulation about exposed backside silicon; and
depositing ball limiting metallurgy pads and solder bumps on the backside of the wafer,
wherein an integrated circuit is formed on said wafer.

2. The method of claim 1, further comprising forming solder connections between the thinned silicon layers from said solder bumps and said ball limiting metallurgy pads, wherein an integrated circuit is formed between die from multiple wafers.

3. The method of claim 1, wherein said holes are drilled with a deep reactive ion etch (DRIE).

4. The method of claim 1, wherein said top surface insulator is removed by a chemical-mechanical polish (CMP).

5. The method of claim 1, wherein said metal fill comprises a barrier, an adhesive, and a conductor.

6. The method of claim 5, wherein said metal fill comprises one of Titanium-Titanium Nitride-Tungsten (Ti—TiN—W), Tantalum-Tantalum Nitride-Tungsten (Ta—TaN—W), Titanium-Titanium Nitride-Copper (Ti—TiN—Cu), and Tantalum-Tantalum Nitride-Copper (Ta—TaN—Cu).

7. The method of claim 1, wherein said back-end-of-line pads are ball limiting metallurgy (BLM) pads and said interconnections are formed from solder.

8. The method of claim 1, wherein said glass handle wafer is attached by means of grinding, polishing, and a reactive ion etch.

9. The method of claim 1, wherein said insulating layer is one or more of a plasma-enhanced chemical vapor deposition (PECVD) oxide layer and a nitride layer.

10. A method of fabricating a thin wafer die, the method comprising the steps of:
creating circuits and front-end-of-line wiring on a silicon wafer;
creating at least a portion of back-end-of-line wiring and pads on a top surface of said wafer for interconnection;

drilling holes in said top surface of said silicon wafer;
depositing an insulator on said drilled holes surface to provide a dielectric insulator to the silicon;
removing any excess surface deposition from the surface;
putting a metal fill into said holes to form through-silicon-vias (TSVs);
completing the creation of said larger back end of line wiring and surface pads, if not already completed;
attaching a glass handle to said silicon wafer with temporary adhesive;
thinning down the wafer to expose the insulator in from the TSV's, wherein said TSVs are adapted to be contacted from a backside of said wafer;
depositing an insulating layer such as PECVD oxide and/or nitride layer which contacts said TSV dielectric;
thinning down the backside of said silicon wafer;
opening through the dielectric to expose the conductor of the TSV to provide dielectric insulation about the exposed backside of said silicon wafer;
depositing ball limiting metallurgy pads and solder bumps on the backside of the wafer; and
forming solder connections between the thinned silicon layers from said solder bumps and said ball limiting metallurgy pads, wherein an integrated circuit is formed between die from multiple wafers.

* * * * *